United States Patent
Asano et al.

(10) Patent No.: US 7,423,921 B2
(45) Date of Patent: Sep. 9, 2008

(54) METHOD AND APPARATUS FOR WORDLINE REDUNDANCY CONTROL OF MEMORY IN AN INFORMATION HANDLING SYSTEM

(75) Inventors: Toru Asano, Omihachiman (JP); Sang H. Dhong, Austin, TX (US); Takaaki Nakazato, Kanagawa (JP); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 11/457,507

(22) Filed: Jul. 14, 2006

(65) Prior Publication Data

US 2008/0013388 A1    Jan. 17, 2008

(51) Int. Cl.
*G11C 7/00* (2006.01)
(52) U.S. Cl. ............. 365/200; 365/185.05; 365/185.09; 365/185.23
(58) Field of Classification Search ................. 365/200, 365/185.05, 185.09, 185.23
See application file for complete search history.

(56) References Cited

U.S. PATENT DOCUMENTS

| | | | | |
|---|---|---|---|---|
| 5,930,185 | A * | 7/1999 | Wendell | 365/201 |
| 6,665,220 | B2 * | 12/2003 | Vlasenko | 365/200 |
| 6,704,228 | B2 | 3/2004 | Jang et al. | |
| 6,856,569 | B2 | 2/2005 | Nelson et al. | |
| 6,862,700 | B2 | 3/2005 | Zhu et al. | |
| 6,885,596 | B2 | 4/2005 | Asano et al. | |

OTHER PUBLICATIONS

Clarke—"Stratup Crafts Nonvolatile Memory from MEMS", EE Times (Jun. 14, 2004).
Davis—"Modern DRAM Memory Systems", ACAL University of Michigan (Apr. 24, 2000).
IBM—"IBM Introduces Chip Morphing Technology" (Jul. 30, 2004).
Iyer—"Embedded DRAM: Technology Platform for the Blue Gene/L Chip", IBM JRD (Mar. 2005).
Mentor—"Mentor Graphics Announces Design-for-Test Support.for Artisan Components' Embedded Memories", Embedded Star (Sep. 19, 2002).
Schlictmann—"Tomorrow's High-Quality SoC's Require High-Quality Embedded Memories Today", Infineon (Mar. 20, 2002).
Siewert—"Apply RAS Architechure Lessons to the Autonomic Self-CHOP Roadmap", IBM (Jul. 6,2005).
Smith—"IBM eFuse To Yield Self-Repairing, Self Regulating CPUs", The Register (Aug. 2, 2004).
TSMC—"TSMC's Electrical Fuse IP", TSMC (Apr. 2005).

* cited by examiner

*Primary Examiner*—Pho M. Luu
(74) *Attorney, Agent, or Firm*—Matthew B Talpis; Mark P Kahler

(57) ABSTRACT

A memory system including a memory array with redundant wordlines. The memory system includes a memory wordline tester that determines if any of the wordlines exhibits a defect. The memory system also includes decoder redundancy logic that efficiently couples to wordline shift logic using a reduced number of control signal lines therebetween. The shift logic shifts defective wordlines to upstream wordlines in the array to bypass the defective wordlines.

20 Claims, 5 Drawing Sheets

FIG. 3

TRUTH TABLE
300

| SIGNAL | SIGNAL VALUE | SIGNAL VALUE | SIGNAL VALUE | SIGNAL VALUE | SIGNAL VALUE |
|---|---|---|---|---|---|
| rc0 | 1 | 1 | 0 | 1 | 1 |
| rc2 | 1 | 0 | 1 | 0 | 0 |
| OVERRIDE | DC | 1 | 0 | 1 | 0 |
| WL BEFORE SHIFT | WL AFTER SHIFT | WL AFTER SHIFT | WL AFTER SHIFT | WL AFTER SHIFT | WL AFTER SHIFT |
| WL0 | WL0 | NOT USED | NOT USED | WL0 | WL0 |
| WL1 | WL1 | NOT USED | WL1 | NOT USED | WL1 |
| WL2 | WL2 | WL0 | WL0 | WL1 | NOT USED |
| WL3 | WL3 | WL1 | WL3 | WL1 | WL3 |
| WL4 | WL4 | WL2 | WL2 | WL2 | WL2 |
| WL5 | WL5 | WL3 | WL5 | WL3 | WL5 |
| COMMENT: | NO SHIFT | SHIFT | SHIFT | SHIFT | SHIFT |
| WL_Reven | NOT USED | WLn-1 | WLn | WLn-1 | WLn |
| WL_Rodd | NOT USED | WLn | NOT USED | WLn | NOT USED |
| DC = DON'T CARE | | | | | |

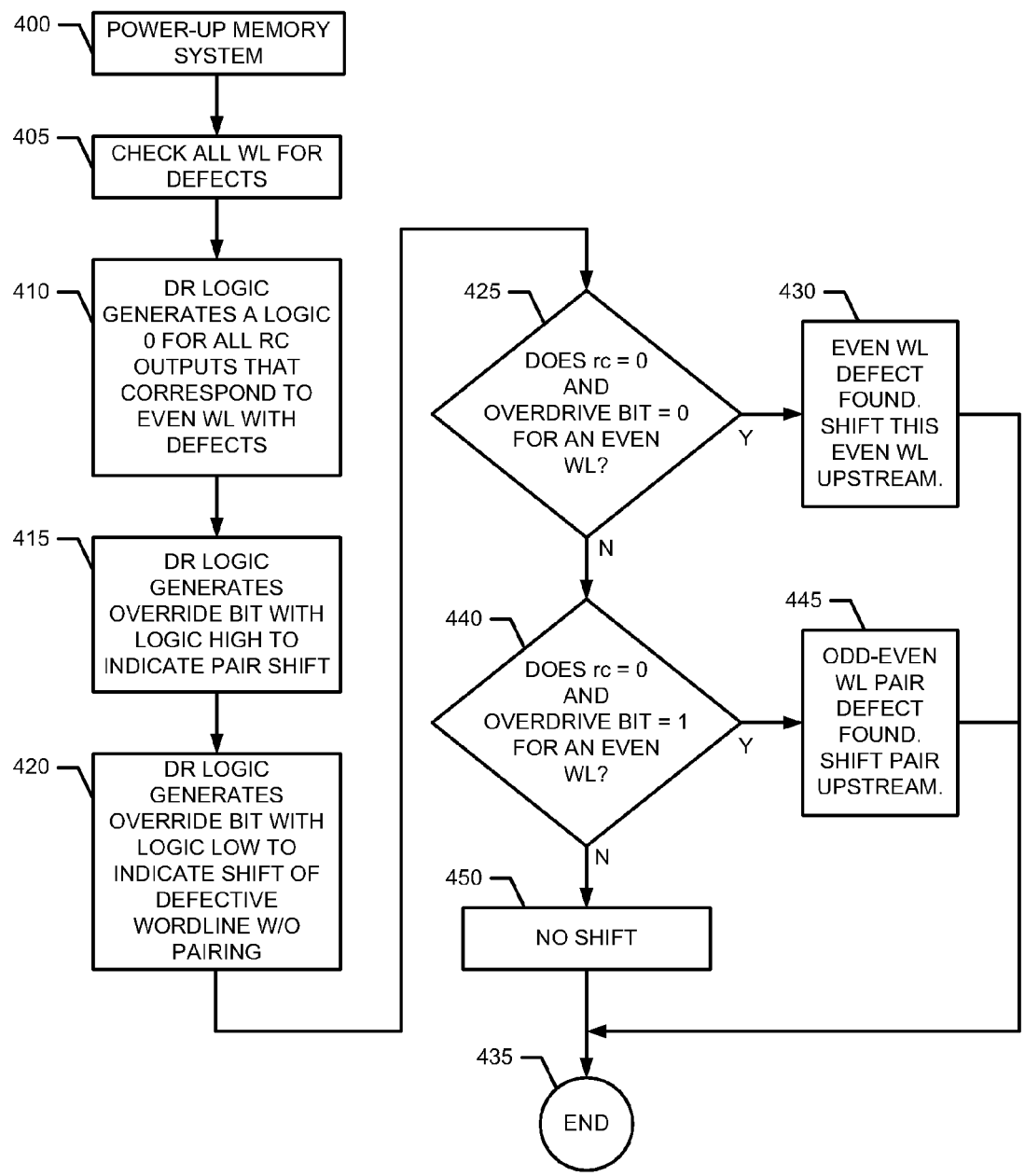

METHOD AND APPARATUS FOR WORDLINE REDUNDANCY CONTROL OF MEMORY IN AN INFORMATION HANDLING SYSTEM

TECHNICAL FIELD OF THE INVENTION

The disclosures herein relate generally to memory systems, and more particularly, to memory systems that employ wordline/bitline redundancy to compensate for memory defects.

BACKGROUND

Random Access Memory (RAM) typically includes an array of memory cells arranged in rows (wordlines) and columns (bitlines). Each cell stores a single bit of data, namely a logic 0 or a logic 1. The intersection of a bitline and a wordline defines the address of a particular memory cell.

To read data in a memory cell, a memory system typically sends the address of that data to a memory controller that decodes the address of the data. The memory controller then uses the decoded address information to access data in the addressed memory cell by activating the particular wordline and bitline that the decoded address information specifies. Because semiconductor manufacturing processes are not 100% defect free, it is possible that an addressed wordline may exhibit a defect and thus yield defective data when the memory controller activates the defective wordline. To lessen the impact of such defects, memory systems may employ wordline/bitline redundancy control techniques. In conventional memory redundancy methodologies, when a decoded address points to a wordline containing a defect, the memory controller employs a mechanism that selects an alternative wordline to effectively bypass the defect.

Memory controllers may employ two stage address decoders that include an initial decode stage and a final decode stage. The initial decode stage pre-decodes a supplied memory address to determine which memory location the memory controller will access. The final decode stage uses the decoded address to activate a selected wordline and bitline to access the addressed memory location. The final decode stage accesses this memory location to either write data to, or read data from, the memory location. Conventional high performance memory systems may employ a decoder wherein the final decode stage shifts from a defective original wordline to an alternative substitute wordline when the memory system determines that the original wordline exhibits a defect. Another term for a substitute wordline is a redundant wordline, namely an extra wordline that is available should the memory system detect a defective wordline. If two adjacent wordlines exhibit defects or errors in a one-bit shift scheme, the final decode stage may shift one defective wordline up in the memory array and the other defective wordline down in the array to activate other available redundant wordlines. Decoders may employ shift registers to shift defective wordlines to redundant wordlines. By shifting wordlines in this manner, a memory controller can avoid or bypass memory defects. Memory controllers may employ the same approach to bypass defective bit lines.

While conventional memory systems can avoid defective wordlines by using redundant wordline methodology, unfortunately the resultant improvement in memory reliability comes at the price of a substantial increase in the amount of logic that the memory system employs. What is needed is a method and apparatus that provides redundancy in a memory system while reducing the complexity and size of the logic circuitry associated with the memory system.

SUMMARY

Accordingly, in one embodiment, a method is disclosed for providing wordline redundancy to a memory system. The method includes testing, by a memory wordline tester, a memory array including a plurality of wordlines to determine if any of the wordlines exhibits a defect, thus providing wordline defect information. The plurality of wordlines includes even wordlines and odd wordlines. The method also includes receiving, by decoder redundancy logic, the wordline defect information. The method also includes generating, by the decoder redundancy logic in response to the wordline defect information, a respective redundancy control signal for each even wordline of the memory array. Each redundancy control signal indicates the presence or absence of a defect in a respective wordline of the memory array. The method further includes generating, by the decoder redundancy logic, an override signal that together with a redundancy control signal indicates the present or absence of a defect in an odd-even wordline pair of the memory array.

In another embodiment, a memory system is disclosed that includes a memory array including a plurality of wordlines. The memory system also includes a memory wordline tester, coupled to the memory array, that tests the plurality of wordlines to determine if any of the wordlines exhibits a defect, thus providing wordline defect information. The plurality of wordlines includes even wordlines and odd wordlines. The memory system also includes decoder redundancy logic, coupled to the memory wordline tester, to receive wordline defect information therefrom. In response to the received wordline defect information, the decoder redundancy logic generates a respective redundancy control signal for each even wordline of the memory array. Each redundancy control signal indicates the presence or absence of a defect in a respective wordline of the memory array. The decoder redundancy logic also generates an override signal that together with a redundancy control signal indicates the present or absence of a defect in an odd-even wordline pair of the memory array.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 3 is a truth table that shows various redundancy control signals that decoder redundancy logic generates and the resultant word line shifts caused by those redundancy control signals.

FIG. 4 shows a flowchart that describes memory processes carried out by the disclosed memory system.

DETAILED DESCRIPTION

Figure 1:
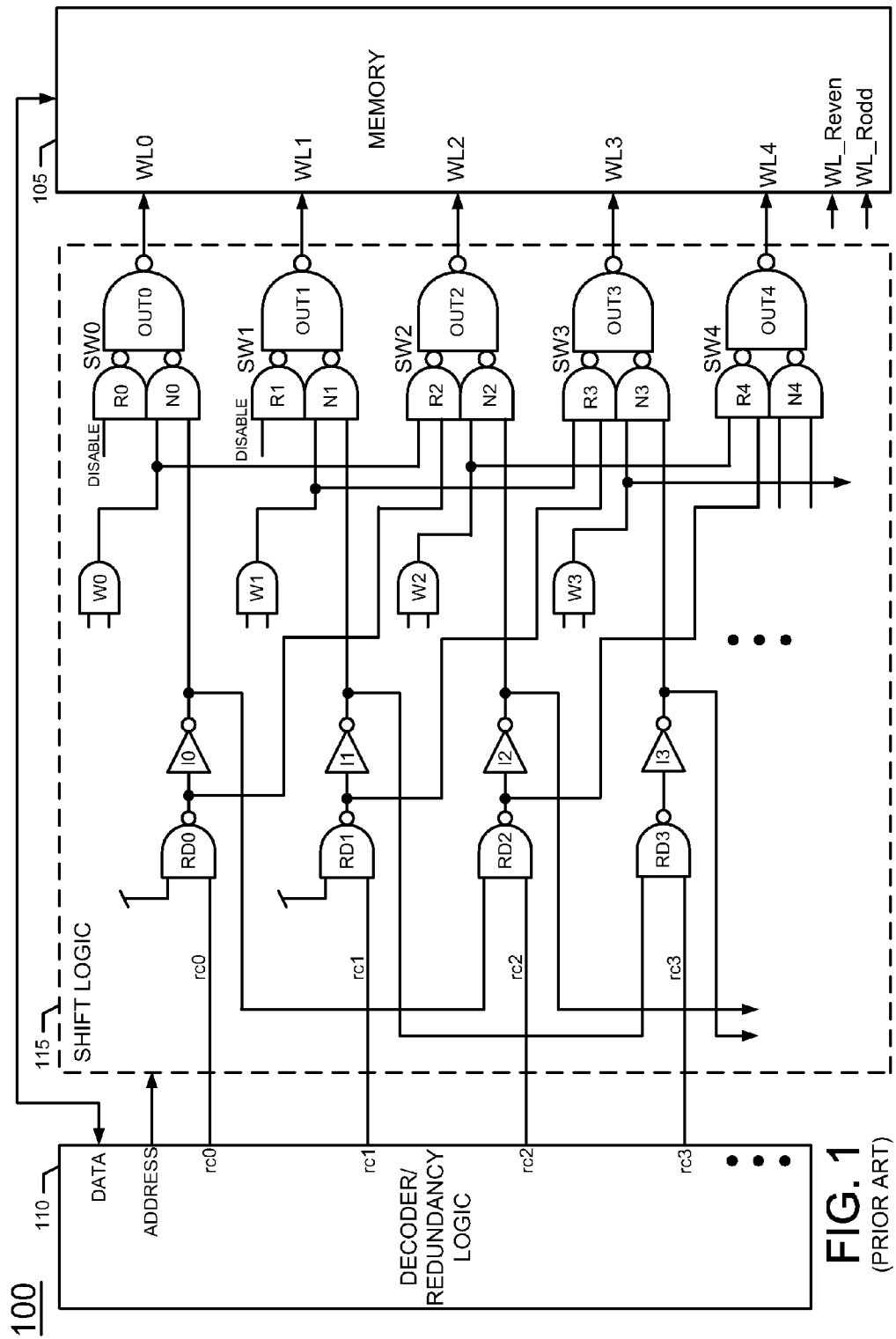
FIG. 1 shows a block diagram of a conventional memory system that employs redundant wordlines.

FIG. 1 shows one conventional type of memory system 100 that employs redundancy to bypass defective wordlines. System 100 includes a memory 105 that includes wordlines WL0, WL1, . . . WL_Reven and WR_Rodd. WL0, WL2, . . . WL_Reven represent even-numbered wordlines. WL1, WL3, . . . WL_Rodd represent odd-numbered wordlines.

WL_Reven defines the highest even-numbered wordline and WL_Rodd defines the highest odd-numbered wordline. These wordlines correspond to rows in a memory cell array that forms memory 105. Memory 105 also includes bit lines (not shown) which define columns in the array of memory 105 in the conventional manner.

Memory system 100 includes decoder/redundancy logic 110 that decodes address information. Wordline tester hardware (not shown) informs decoder/redundancy logic 110 of any defective wordlines in memory 105. Memory system 100 includes shift logic 115 that enables system 100 to bypass defective wordlines by effectively turning off a defective wordline and shifting the function of the defective wordline to an alternative redundant wordline. In addition to decoding memory addresses, decoder/redundancy logic 110 instructs shift logic 115 with respect to which particular defective wordlines requiring shifting to alternative redundant wordlines. Decoder/redundancy (DR) logic 110 provides instructions to shift logic 115 to enable system 100 to write data to, or read data from, memory 105. Shift logic 115 includes AND address data gates W0, W1, W2, WL3 . . . WL_Rodd (not shown), namely one AND data gate per wordline. These AND gates receive address signals and act as a final decode stage for decoder/redundancy logic 110. Shift logic 115 includes one control path per memory wordline to enable decoder/redundancy logic 110 to control the operation of the wordlines. Each control path allows the communication of data between DR logic 110 and a respective wordline of memory 105 or an alternative to that wordline.

A representative control path for wordline WL0 includes AND gate RD0, inverter I0 and an address data gate W0. The control path for wordline WL0 also includes switching logic SW0 that enables the control path to operate in a normal mode or a bypass mode. In normal mode, address data gate W0 provides address data to switching logic SW0 for writing to wordline WL0 in memory 105. Alternatively, in bypass mode, system 100 disables wordline WL0 and shifts the address data to another wordline, for example, wordline W2. In this first example wherein wordline WL0 exhibits a defect, system 100 shifts address data from even wordline WL0 to even wordline WL2. In this document, shift mode is another name for bypass mode, in that system 100 shifts address data away from a defective wordline and shifts the address data to an alternative wordline. Switch logic SW0 includes a redundancy path gate R0 and a normal path gate N0. The output of each of the gates R0 and N0 couples to respective inputs of an output gate OUT0 that couples to wordline WL0 of memory 105. Switch logic SW0 includes output gate OUT0 in addition to redundancy path gate R0 and normal path gate N0. In response to control signals from DR logic 110, switch logic SW0 may send address data from address data gate W0 to wordline WL0 in normal mode or isolate wordline WL0 in bypass mode. When operating in bypass mode to avoid a defective wordline, switch logic SW2 sends the address data originally intended for wordline WL0 to word line WL2.

In more detail, DR logic 110 employs testing hardware (not shown) that tests all wordlines in memory 105 to determine if any wordlines exhibit a defect. If any wordline exhibits a defect, then DR logic 110 signals that defect on the corresponding redundancy control (rc) output of DR 110. DR logic 110 includes one redundancy control (rc) output per wordline, namely redundancy outputs rc0, rc1, rc2, . . . and so forth up to the end of the memory array. In the present first example wherein wordline WL0 exhibits a defect, DR logic 110 raises the state of the redundancy control signal rc0 high at output rc0. In response, inverter I0 instructs switching logic SW0 to bypass or isolate wordline WL0. The address data from gate W0 thus does not reach wordline WL0, but rather flows to gate R2 of switching logic SW2. The output of gate RD0 couples to gate R2. When DR logic 110 asserts or drives the redundancy control signal rc0 high, in the response the output signal from gate RD0 instructs gate R2 to pass the address data from gate W0 through to wordline WL2. Thus, under these circumstances, wherein wordline WL0 exhibits a defect, system 100 effectively bypasses the defective WL0 wordline and shifts the address data instead to alternative wordline WL2.

The control paths for the remainder of memory system 100, namely the control paths for wordlines WL1, WL2, . . . WL_Rodd are similar to the control path for wordline WL0 discussed above. While FIG. 1 shows representative remaining control paths for wordlines WL1, WL2 and WL3, system 100 includes respective control paths for each wordline following the topology that FIG. 1 illustrates. More particularly, the control path for wordline WL1 includes gates RD1, inverter I1, address data gate W1, and switching logic SW1 that couples to wordline WL1. The control path for wordline WL2 includes gate RD2, inverter I2, address data gate W2, and switching logic SW2 that couples to wordline WL2. Continuing with the same topology as the control path for wordline WL2, the control path for control path WL3 includes gate RD3, inverter I3, address data gate W3, and switching logic SW3 that couples to wordline WL3. This topology continues with similarly configured control paths for the remaining wordlines up to and including the control path for wordline WL_Rodd which FIG. 1 does not specifically show due to space limitations.

The first example above discusses the case wherein wordline WL0 exhibits a defect. In response, system 100 disables wordline WL0 and shifts to wordline WL2 instead. In another second example, both wordlines WL0 and WL1 may exhibit no defects. Thus, redundancy control signals rc0 and rc1 exhibit a low logic state so that the control paths for wordlines WL0 and WL1 operate in normal mode with no shifting. In the second example, while wordlines WL0 and WL1 exhibit no defects, test hardware determines that wordline WL2 exhibits a defect. In response to this detection, DR logic 110 asserts the redundancy control signal rc2 as a logic high. Assertion of the redundancy control signal rc2 causes switching logic SW2 to first isolate wordline WL2. And second, assertion of signal rc2 instructs switching logic SW4 to couple address data gate W2 to wordline WL4 so that wordline WL4 can take the place of defective wordline WL2.

In the $2^{nd}$ example above, when system 100 determines that wordline WL2 exhibits an error, WL2 effectively shifts to wordline WL4. This causes wordline WL4 to shift to wordline WL6, and so forth in similar fashion to the end of the memory array 105 at wordline WL_Reven. In this arrangement, even-numbered word lines shift to other even-numbered wordlines up through to the end of memory array 105. In some situations, it may be likely that the wordline adjacent WL2, namely WL3, also exhibits an error. In that event, wordline WL3 shifts to wordline WL5 (not shown). This causes wordline WL5 to shift to wordline WL7 (not shown), and so forth in similar fashion to the end of memory array 105 at wordline WL_Rodd. In other words, even-numbered wordlines shift to other higher even-numbered wordlines and odd-numbered wordlines shift to other higher-numbered wordlines.

In a $3^{rd}$ example, system 100 determines that wordline WL2 exhibits an error. Again, WL2 effectively shifts to wordline WL4. However, system 100 determines that the wordline adjacent defective wordline WL2, namely odd-numbered wordline WL3 exhibits no error. In this instance, even-numbered wordline WL2 shifts to the next higher even-numbered wordline, namely wordline WL4. The higher even-numbered wordlines in the memory array 105 also shift upward. For example, wordline WL4 shifts to wordline WL6 (not shown), and wordline WL6 shifts to wordline WL8 (not shown). However, because system 100 finds no error in odd-numbered wordline WL3, the odd-numbered wordlines do not shift. In the conventional redundancy techniques described above, even-numbered wordlines shift to higher even-numbered wordlines when the tester finds a defect in an even-numbered wordline. Likewise, odd-numbered wordlines shift to higher odd-numbered wordlines when the tester finds a defect in an odd-numbered wordline.

Odd and even grouping of wordlines is one redundant wordline technique that reduces the control logic that a high performance memory system employs. U.S. Pat. No. 6,885,596 entitled "Apparatus and Method of Wordline/Bitline Redundancy Control Using Shift Registers in an SRAM, by Asano et al., describes such a redundant wordline methodology. One embodiment of Asano et al. employs odd and even shift registers that instruct odd and even steering circuits to couple to respective odd and even wordlines when an address decoder detects no odd or even wordline error, and to couple to respective odd and even redundant wordlines when the decoder detects and odd or even wordline error. The disclosure of U.S. Pat. No. 6,885,596 is incorporate herein by reference in its entirety.

Figure 2:
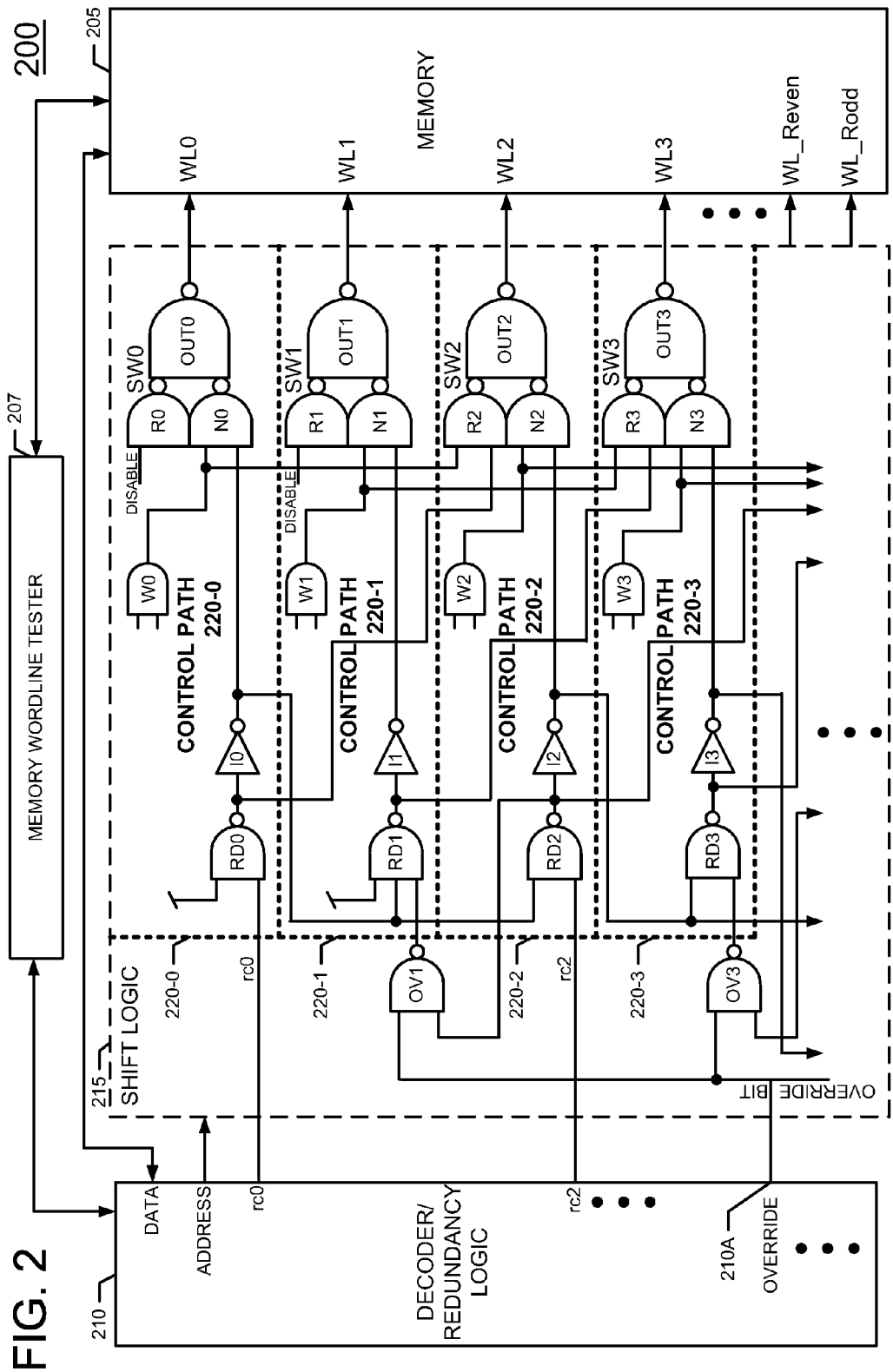
FIG. 2 shows a block diagram of the disclosed memory system.

FIG. 2 shows one embodiment of the disclosed memory system 200. In comparison with memory system 100 of FIG. 1, memory system 200 employs a reduced number of redundancy control (rc) signal lines between the decoder/redundancy (DR) logic and the shift logic that drives the wordlines of the memory array. Memory system 200 includes elements in common with memory system 100 of FIG. 1. When comparing system 200 and system 100, like numbers and characters indicate like elements. Memory system 200 includes a memory array 205 having four representative wordlines, namely WL0, WL1, WL2, WL3 as well as two representative redundant wordlines WRL_Eeven and WL_Rodd. In actual practice, many word lines exist between representative wordline WL4 and wordlines WL_Reven and WL_Rodd at the upper end of the memory array. The actual number of word lines between WL4 and the end of the array depends of the size of the array in a particular application. Memory system 200 includes decoder/redundancy (DR) logic 210 that couples to a hardware tester, namely memory wordline tester 207. Memory wordline tester 207 tests the wordlines of memory array 205 to determine if any wordline thereof exhibits a defect. When memory wordline tester 207 finds a defect in an even-numbered wordline such as WL0 or WL2, then DR logic 210 asserts the redundancy control (rc) signal corresponding to the defective wordline. For example, if the memory wordline tester 207 finds a defect in wordline WL0, then DR logic 210 asserts the rc0 signal as a logic high at the rc0 output of DR logic 210. Likewise, if the memory wordline tester 207 finds a defect in wordline WL2, then DR logic 210 asserts the rc2 signal as a logic high at the rc2 output of DR logic 210.

Memory system 200 includes shift logic 215 that shifts wordlines to achieve wordline redundancy. Shift logic 215 employs one control path per wordline. More particularly, for wordlines WL0, WL1, WL2 and WL3, shift logic 215 includes respective control paths 220-0, 220-1, 220-2 and 220-3. Control path 220-0 includes gate RD0, inverter I0, address data gate W0 and switching logic SW0, all of which couple between redundancy control output rc0 and wordline WL0, as shown. Control path 220-1 includes gate RD1, inverter I1, address data gate W1 and switching logic SW1, all of which couple between redundancy RD logic 210 and wordline WL1, as shown. Control path 220-2 includes gate RD2, inverter I2, address data gate W2 and switching logic SW2, all of which couple between redundancy control output rc2 and wordline WL2, as shown. Control path 220-3 includes gate RD3, inverter I3, address data gate W3 and switching logic SW3, all of which couple between redundancy RD logic 210 and wordline WL3, as shown. Ellipsis below control path 220-3 indicate that shift logic 215 may in practice include as many control paths as wordlines in memory array 205, one control path corresponding to each wordline in the same manner as the 4 representative control paths and wordlines that FIG. 2 illustrates.

Each even-numbered control path, such as 220-0 and 220-2, couples to a respective dedicated redundancy control line, such as rc0 and rc2, as shown in FIG. 2. However, the odd-numbered control paths, such as 220-1 and 220-3 share a common bit, namely an override bit from the override port of DR logic 210. This configuration reduces the number of redundancy control (rc) lines between DR logic 210 and shift logic 215. In more detail, to provide redundancy capability for odd-numbered wordline WL1, shift logic 215 includes a two input AND gate OV1 that couples to one input of AND gate RD1 as shown. One input of AND gate OV1 couples to the override output of DR logic 210 and the remaining input of AND gate couples to control path 220-2 as shown. Similarly, to provide redundancy capability for odd-numbered wordline WL3, shift logic 215 includes a two input AND gate OV3 that couples to one input of AND gate RD3 as shown. One input of AND gate OV3 couples to the override output of DR logic 210 and the remaining input of AND gate couples to a next higher control path for the next higher wordline above wordline WL3, provided the memory array is larger than 4 wordlines.

The redundancy apparatus that FIG. 2 depicts treats even/odd word lines as a pair. In normal operation, the tester hardware in DL logic 210 finds no defects in any of the word lines WL0, WL1, WL2, etc. In this instance, DR logic generates a logic high for each of the redundancy control (rc) signal rc0 and rc2. In response to these signal states, shift logic 215 performs no shifting of the word lines because the word lines exhibit no defects to correct. However, when rc2=1 and the override bit=1, shift logic 215 commences shifting at word line WL0 as an even-odd pair shift wherein word line WL0 shifts to word line WL2 and word line WL1 shifts to word line WL3. In contrast, when rc2=0 and the override bit=1, shift logic 215 commences shifting at wordline WL1 as an odd-even pair shift wherein wordline WL1 shifts to wordline WL3 and wordline WL2 shifts to wordline WL4 (not shown). In comparing memory system 200 with memory system 100, memory system 100 requires 4 redundancy control bits for the particular memory array shown, while memory system 200 requires 2 redundancy control bits plus one override bit to achieve redundancy in the memory array shown.

FIG. 3 shows a truth table 300 that depicts various states of representative redundancy control signals rc0, rc2 and the override signal together with the resultant wordline shifts. The state of the redundancy control signals rc0, rc2 and the override signal together determine which particular wordlines, if any, shift due to detected wordline defects. When memory wordline tester 207 finds no defective wordlines, then DR logic 210 generates rc0 and rc1 signals that each exhibits a logical 1 value as seen in column 302 of truth table 300. In this scenario, no wordlines shift because the memory wordline tester 207 finds no wordline errors. In comparing the wordlines WL0-WL5 before shift in column 301 with wordlines WL0-WL5 after shift in column 302, the wordline positions remain unchanged because DR logic 210 commanded no wordline shifting. Thus, the redundant wordlines WL_Reven and WL_Rodd at the end of memory array 205 remain unused, as the corresponding NOT USED designation in column 302 indicates. In this particular case, the value of the override bit is a don't care (DC). Note that, due to space limitations, FIG. 2 does not separately illustrate word lines between word line WL3 and the redundant wordlines WL_Reven and WL_Rodd at the upper end of memory array 205.

When the memory wordline tester 207 finds a defect in wordline WL0, then DR logic 110 generates a redundancy control signal rc0, a redundancy control signal rc2 and an override signal exhibiting values 0, 1 and 1 respectively as seen in column 303. In response, shift logic 215 disables even-numbered wordline WL0 and the adjacent odd-numbered wordline WL1 as the designation "NOT USED" indicates in column 303. In this case, DR logic 210 assumes that because wordline WL0 exhibits an error, it is possible that adjacent wordline WL1 may also exhibit an error. Further in response, shift logic 215 also shifts wordlines WL0 and WL1 (an even-odd wordline pair) to wordlines WL2 and WL3, as seen in column 303. Moving wordlines WL0 and WL1 to wordlines WL2 and WL3 in this manner triggers further upstream shifting assuming that memory array 205 includes more than the 4 wordlines that FIG. 2 illustrates. For example, wordlines WL2 and WL3 shift to wordlines WL4 and WL5. Even-odd wordline pair shifting continues in this manner upstream in memory array 205 to the end of the array. The term "downstream" refers to those wordlines lower in memory than the wordline where shifting begins. The term "upstream" refers to those wordlines higher in memory than the wordline where shifting begins. In this particular example, WLn represents the last odd word line in memory array 205 before redundant word lines WL_Reven and WL_Rodd. WLn-1 represents the even word line immediately below odd word line WLn in memory array 205. The word lines of word line pair WLn-1 and WLn shift to redundant word lines WL_Reven and WL_Rodd, respectively, as shown in column 303.

In another scenario, the memory wordline tester 207 finds a defect in wordline WL0 but does not assume an error in adjacent wordline WL1. In this case, DR logic 210 generates rc0, rc2 and override signals exhibiting values 0, 1, 0 respectively as seen in column 304. In response, shift logic 215 disables wordline WL0 as the "NOT USED" designation indicates in column 304 for wordline WL0. Shift logic 215 shifts wordline WL0 to WL2. In other words, an even wordline shifts upward to another even wordline. However, wordline WL1 remains as wordline WL1 because wordline WL1 contains no defect. Upstream from wordline WL2 (which now corresponds to wordline WL0) the odd wordlines WL3, WL5 . . . WL_Rodd remain unshifted up to the end of the memory array 205. However, upstream from wordline WL2, the even wordlines shift to accommodate the shift of WL0 to WL2. For example, wordline WL2 shifts to wordline WL4, wordline WL4 shifts to wordline WL6 (not shown) and so forth up to wordline WL_Reven at the end of the memory array 205. Wordline WL_Reven contains the shifted WLn wordline.

In yet another scenario, the memory wordline tester 207 finds a defect in a wordline somewhere in the middle of the memory array 205, namely at a location other than the wordline WL0 at the beginning of array. For example, memory wordline tester 207 finds no error in wordline WL0, but detects an error in wordline WL1. In this case, DR logic 210 generates rc0, rc2 and override signals exhibiting values 1, 0, 1 respectively as seen in column 305. DR logic 210 in this case assumes that not only odd-numbered wordline WL1 exhibits a defect, but also that adjacent even-numbered wordline WL2 may also exhibit a defect. In response, shift logic 215 disables wordlines WL1 and WL2 as the "NOT USED" designations in column 305 indicate. Also, in response to the rc0, rc2 and override signals, shift logic 215 shifts the odd-even wordline pair WL1 and WL2 to wordlines WL3 and WL4 as seen in column 305. Upstream shifting continues to the end of the memory array 205. For example, wordlines WL3 and WL4 shift to wordlines WL5 and WL6 (not shown), wordlines WL5 and WL6 shift to wordlines WL7 and WL8 (not shown), and so forth to the end of memory array 205. Wordlines WLn-1 and WLn shift to redundant word lines WL_Reven and WL_Rodd, respectively.

In another case, the memory wordline tester 207 finds a defect in a wordline somewhere in the middle of the array, for example an even-numbered wordline such as wordline WL2. In this particular case, DR logic 210 does not assume an error in the adjacent odd-numbered wordline WL3. In this example, DR logic 210 generates rc0, rc2 and override signals exhibiting values 1, 0, 0 respectively as seen in column 306. Downstream wordlines WL0 and WL1, which exhibit no defects, remain unshifted as seen in column 306. However, the wordline WL2 that exhibits an error, shifts to even-numbered wordline WL4. Shift logic 215 does not shift any of the odd-numbered wordlines. Because even-numbered wordline WL2 shifts to even-numbered wordline W4, the remaining upstream even-numbered wordlines shift in a similar manner upward to the end of memory array 205. For example, shift logic 215 shifts wordline WL4 to wordline WL6 (not shown), and further shifts wordline WL6 to wordline WL8 (not shown), and so forth to the end of the memory array. The last even-numbered word line, in this case WLn, shifts into redundant word line WL_Reven as shown.

FIG. 4 shows a flowchart that summarizes the wordline redundancy methodology that one embodiment of memory system 200 employs. In this particular example, when the redundancy control signal rc0=0, this indicates a defect in the respective WL0 word line. When rc2=0, this indicates a defect in the respective WL2 wordline. This relationship between redundancy control signals and respective wordlines continues through the remainder of the even word lines of memory array 205. In the flowchart of FIG. 4, process flow begins at start block 400 at which memory system 200 powers up. Memory wordline tester 207 then checks all word lines WL0, WL1, . . . WLn for defects, as per block 405. DR logic 210 generates a logic 0 or low on any redundancy control (rc) output that corresponds to an even wordline exhibiting defects, as per block 410. For example, if even wordline WL0 exhibits a defect, then DR logic 210 generates a logic low on the rc0 output to indicate that defect. If even wordline WL2 exhibits a defect, then DR logic 210 generates a logic low on the rc2 output to indicate that defect.

However, memory system 200 handles defects in odd wordlines in a manner different from defects in even wordlines. DR logic 210 employs an override bit line 210A to indicate errors in odd word lines. More particularly, DR logic 210 generates an override bit signal exhibiting a logic 1 to indicate a wordline shift of a wordline pair including an odd word line, as per block 415. DR logic 210 generates an override bit signal exhibiting a logic 0 to indicate a wordline shift not involving a wordline pair, i.e. involving an even wordline instead, as per block 420.

In more detail, to indicate an error in an odd word line, DR logic 210 asserts a logic 1 on the override bit line 210A and asserts a logic 0 on an rc output immediately adjacent the odd wordline exhibiting a defect. This results in a wordline pair shift. For example, if odd wordline W1 exhibits a defect, then DR logic 210 generates a logic 1 on the override bit line, a logic 0 on the rc0 redundancy control line, and a logic 1 on the rc2 redundancy control line, as seen in column 303 of the FIG. 3 truth table. Alternatively, DR logic 210 may also indicate a defect in odd wordline W1 by generating a logic 1 on the override bit line, a logic 1 on the rc0 redundancy control line, and a logic 0 on the rc2 redundancy control line, as seen in column 305.

Shift logic 215 responds to the redundancy control signals and the override bit signal in the following manner. Shift logic 115 effectively performs a test at decision block 425 to determine if a particular wordline's redundancy control (rc) signal is 0 and the override bit is also 0. If the redundancy control signal for a particular even wordlines is 0 and the override bit is also zero, then this even word line exhibits a defect and shift logic 215 shifts this particular even word line to the nearest upstream even word line, as per block 430. For example, if the redundancy control signal, rc0, associated with even wordline WL0 exhibits a 0 and the override bit exhibits a 0, this indicates a defect in wordline WL0. In response, shift logic 215 shifts wordline WL0 to WL2 as seen in column 304 of truth table 300. In another example, if the redundancy control signal rc2 associated with even word line WL2 exhibits a 0 and the override bit exhibits a 0, then this indicates a defect in wordline WL0. In response, shift logic 215 shifts word line WL2 to WL4, as seen in column 306 of truth table 300. In each of these examples of even wordline errors, the defective wordline shifts to another even wordline, as opposed to the defective wordline and an adjacent odd wordline together shifting upstream in the memory array. Once the shifting action of block 430 completes, process flow ends at end block 435.

If decision block 425 finds no even wordline defect, then process flow continues to decision block 440 that conducts a test to determine if a defect exists in an odd wordline-even wordline pair. To achieve this end, decision block 440 tests to determine if the override bit is 1 and if any even word line's redundancy control signal is 0. This combination of rc and override bit values indicates that an error exists in an odd-even pair, namely the even wordline to which the rc signal corresponds and an adjacent odd wordline, thus forming an odd-even wordline pair. Shift logic 215 shifts this odd-even wordline pair upstream in memory array 205 to bypass a defective wordline in the odd-even wordline pair, as per block 445. For example, if the override bit is 1 and the redundancy control signal rc0 is 0, then odd-even wordline pair WL1-WL0 shifts upstream to WL3-WL2 in memory array 205, as column 303 indicates in truth table 300. Shift logic 215 treats this situation as if one or both of WL1 and WL0 exhibit a defect. Alternatively stated, odd-even wordline pair WL1-WL0 exhibits a defect.

Another example of an odd-even wordline pair exhibiting a defect in either the odd or even wordline follows. If the override bit is 1 and the redundancy control signal rc2 is 0, then odd-even wordline pair WL1-WL2 shifts upstream to WL3-WL4 in memory array 205, as column 305 indicates in truth table 300. Shift logic 215 treats this situation as if one or both of WL1 and WL2 exhibits a defect and shifts both upstream as a pair, as per block 445. Alternatively stated, odd-even wordline pair WL1-WL2 exhibits a defect. Because after shifting WL1 and WL2 now occupy WL3 and WL4, this causes additional shifting, namely WL3-WL4 shifts to WL5-WL6. Shifting of odd-even WL pairs continues propagating in this manner upstream in memory array 205 to the end of the array. When shifting completes, process flow ends at block 435. While for discussion purposes the flowchart of FIG. 4 depicts decision blocks 425 and 440 sequentially, in actual practice the functions of block 425 and 440 may occur simultaneously. In one embodiment, only odd wordlines shift when decoder/redundancy logic 210 assert the override bit.

Figure 5:
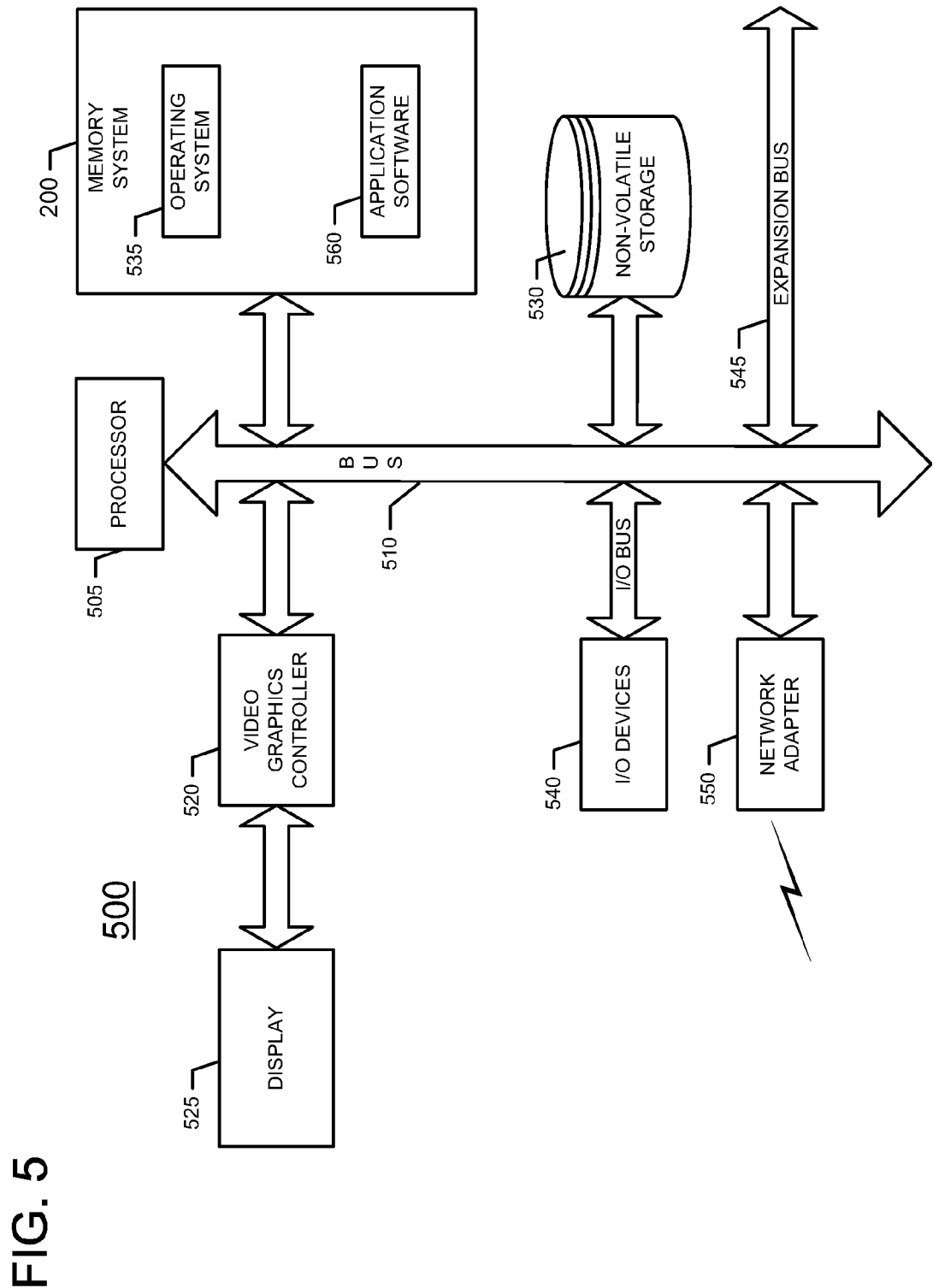
FIG. 5 shows an information handling system that employs the disclosed memory system.

FIG. 5 shows an information handling system (IHS) 500 including a processor 505 that couples to memory system 200 via a bus 510. Bus 510 also couples processor 505 to a video graphics controller 520. A display 525 couples to video graphics controller 520. Nonvolatile storage 530, such as a hard disk drive, CD drive, DVD drive, or other nonvolatile storage couples to bus 510 to provide IHS 500 with permanent storage of information. An operating system 535 loads in memory 200 to govern the operation of IHS 500. I/O devices 540, such as a keyboard and a mouse pointing device, couple to bus 510. One or more expansion busses 545, such as USB, IEEE 1394 bus, ATA, SATA, PCI, PCIE and other busses, couple to bus 510 to facilitate the connection of peripherals and devices to IHS 500. A network adapter 550 couples to bus 510 to enable IHS 500 to connect by wire or wirelessly to a network and other information handling systems. While FIG. 5 shows one IHS that employs memory system 200, the IHS may take many forms. For example, IHS 500 may take the form of a desktop, server, portable, laptop, notebook, or other form factor computer or data processing system. IHS 500 may take other from factors such as a personal digital assistant (PDA), a gaming device, a portable telephone device, a communication device or other devices that include a processor and memory.

The foregoing discloses a memory system that provides wordline redundancy and an efficient wordline shifting mechanism between the decoder/redundancy logic and the memory array of the system.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of providing wordline redundancy to a memory system, the method comprising:

testing, by a memory wordline tester, a memory array including a plurality of wordlines to determine if any of the wordlines exhibits a defect, thus providing wordline defect information, the plurality of wordlines including even wordlines and odd wordlines;

receiving, by decoder redundancy logic, the wordline defect information;

generating, by the decoder redundancy logic in response to the wordline defect information, a respective redundancy control signal for each even wordline of the memory array, each redundancy control signal indicating the presence or absence of a defect in a respective wordline of the memory array; and generating, by the decoder redundancy logic, an override signal that together with a redundancy control signal indicates the present or absence of a defect in an odd-even wordline pair of the memory array.

2. The method of claim 1, further comprising shifting, by shift logic coupled between the decoder redundancy logic and the memory array, a designated even wordline in the memory array to an alternative even wordline in the memory array when the redundancy control signal for the designated even wordline indicates the presence of a defect in the designated even wordline.

3. The method of claim 2, further comprising shifting, by the shift logic, a designated odd-even wordline pair in the memory array to an alternative odd-even wordline pair in the memory array when the override signal together with a redundancy control signal indicates the presence of a defect in the designated odd-even wordline pair.

4. The method of claim 3, further comprising allowing, by the shift logic, a first even wordline in the array to remain unshifted when the respective redundancy control signal for the first even wordline indicates the absence of a defect in the first even wordline.

5. The method of claim 3, further comprising allowing, by the shift logic, a first odd-even wordline pair in the memory array to remain unshifted when the override signal together with a redundancy control signal indicates the absence of a defect in the first odd-even wordline pair.

6. The method of claim 3, further comprising shifting, by the shifting logic, the odd-even wordline pairs upstream from the designated odd-even wordline pair to other odd-even wordline pairs higher in the memory array to accommodate shifting of the designated odd-even wordline pair to the alternative odd-even wordline pair.

7. The method of claim 2, further comprising shifting, by the shifting logic, even wordlines upstream from the designated even wordline to other even word lines higher in the memory array to accommodate shifting of the designated even wordline to the alternative even wordline.

8. A memory system comprising:
a memory array including a plurality of wordlines;
a memory wordline tester, coupled to the memory array, that tests the plurality of wordlines to determine if any of the wordlines exhibits a defect, thus providing wordline defect information, the plurality of wordlines including even wordlines and odd wordlines; and
decoder redundancy logic, coupled to the memory wordline tester, to receive wordline defect information therefrom and that in response thereto generates a respective redundancy control signal for each even wordline of the memory array, each redundancy control signal indicating the presence or absence of a defect in a respective wordline of the memory array; and that generates an override signal that together with a redundancy control signal indicates the present or absence of a defect in an odd-even wordline pair of the memory array.

9. The memory system of claim 8, further comprising shift logic, coupled between the decoder redundancy logic and the memory array, that shifts a designated even wordline in the memory array to an alternative even wordline in the memory array when the redundancy control signal for the designated even wordline indicates the presence of a defect in the designated even wordline.

10. The memory system of claim 9, wherein the shift logic shifts a designated odd-even wordline pair in the memory array to an alternative odd-even wordline pair in the memory array when the override signal together with a redundancy control signal indicates the presence of a defect in the designated odd-even wordline pair.

11. The memory system of claim 10, wherein the shift logic allows a first even wordline in the array to remain unshifted when the respective redundancy control signal for the first even wordline indicates the absence of a defect in the first even wordline.

12. The memory system of claim 10, wherein the shift logic allows a first odd-even wordline pair in the memory array to remain unshifted when the override signal together with a redundancy control signal indicates the absence of a defect in the first odd-even wordline pair.

13. The memory system of claim 10, wherein the shift logic shifts the odd-even wordline pairs upstream from the designated odd-even wordline pair to other odd-even wordline pairs higher in the memory array to accommodate shifting of the designated odd-even wordline pair to the alternative odd-even wordline pair.

14. The memory system of claim 9, wherein the shift logic shifts even wordlines upstream from the designated even wordline to other even word lines higher in the memory array to accommodate shifting of the designated even wordline to the alternative even wordline.

15. An information handling system (IHS) comprising:
a processor;
a memory system coupled to the processor, the memory system including:
a memory array including a plurality of wordlines;
a memory wordline tester, coupled to the memory array, that tests the plurality of wordlines to determine if any of the wordlines exhibits a defect, thus providing wordline defect information, the plurality of wordlines including even wordlines and odd wordlines; and
decoder redundancy logic, coupled to the memory wordline tester, to receive wordline defect information therefrom and that in response thereto generates a respective redundancy control signal for each even wordline of the memory array, each redundancy control signal indicating the presence or absence of a defect in a respective wordline of the memory array; and that generates an override signal that together with a redundancy control signal indicates the present or absence of a defect in an odd-even wordline pair of the memory array.

16. The IHS of claim 15, further comprising shift logic, coupled between the decoder redundancy logic and the memory array, that shifts a designated even wordline in the memory array to an alternative even wordline in the memory array when the redundancy control signal for the designated even wordline indicates the presence of a defect in the designated even wordline.

17. The IHS of claim 16, wherein the shift logic shifts a designated odd-even wordline pair in the memory array to an alternative odd-even wordline pair in the memory array when the override signal together with a redundancy control signal indicates the presence of a defect in the designated odd-even wordline pair.

18. The IHS of claim 17, wherein the shift logic allows a first even wordline in the array to remain unshifted when the respective redundancy control signal for the first even wordline indicates the absence of a defect in the first even wordline.

19. The IHS of claim 17, wherein the shift logic allows a first odd-even wordline pair in the memory array to remain unshifted when the override signal together with a redundancy control signal indicates the absence of a defect in the first odd-even wordline pair.

20. The IHS of claim 17, wherein the shift logic shifts even wordlines upstream from the designated even wordline to other even word lines higher in the memory array to accommodate shifting of the designated even wordline to the alternative even wordline, and wherein the shift logic shifts the odd-even wordline pairs upstream from the designated odd-even wordline pair to other odd-even wordline pairs higher in the memory array to accommodate shifting of the designated odd-even wordline pair to the alternative odd-even wordline pair.

* * * * *